United States Patent  
Chen et al.

(10) Patent No.: US 11,955,960 B2  
(45) Date of Patent: Apr. 9, 2024

(54) DEPLETION MODE GaN TRANSISTOR CONTROL CIRCUIT AND CORRESPONDING METHOD

(71) Applicant: Chip-GaN Power Semiconductor Corporation, Hsinchu (TW)

(72) Inventors: Ke-Horng Chen, Hsinchu (TW); Tzu-Hsien Yang, Hsinchu (TW); Yong-Hwa Wen, Hsinchu (TW); Kuo-Lin Cheng, Hsinchu (TW)

(73) Assignee: CHIP-GAN POWER SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/893,684

(22) Filed: Aug. 23, 2022

(65) Prior Publication Data  
US 2024/0072790 A1 Feb. 29, 2024

(51) Int. Cl.  
H03K 19/003 (2006.01)  
H03K 17/16 (2006.01)

(52) U.S. Cl.  
CPC ..... H03K 17/165 (2013.01); H03K 19/00346 (2013.01); H03K 19/00361 (2013.01)

(58) Field of Classification Search  
CPC ........... H03K 17/165; H03K 19/00346; H03K 19/00361; H03K 17/16; H03K 17/161  
See application file for complete search history.

(56) References Cited

U.S. PATENT DOCUMENTS 9,461,637 B2 * 10/2016 Hwang ................ H03K 17/063

* cited by examiner

Primary Examiner — Jung Kim  
(74) Attorney, Agent, or Firm — WPAT, PC

(57) ABSTRACT

The invention uses the control circuit formed on the silicon wafer to detect the leakage current of transistor formed on the depletion mode GaN wafer and then adjust the gate voltage of the depletion mode GaN transistor according to the detected leakage current. Essentially, the gate voltage is reduced or viewed as made more negative when the detected leakage current is larger a specific value. Thus, the gate voltage can be gradually adjusted to approach a specific threshold voltage that right block the leakage current. In other words, by making the gate voltage more negative when non-zero leakage current is detected and even by making the gate voltage more positive when zero leakage current is detected, the depletion mode GaN transistor can be adjusted to have an acceptable or even zero leakage current, a high reaction rate and an optimized efficiency.

12 Claims, 9 Drawing Sheets

DEPLETION MODE GaN TRANSISTOR CONTROL CIRCUIT AND CORRESPONDING METHOD

FIELD OF THE INVENTION

The invention is proposed to minimize leakage current of transistor formed on depletion mode GaN wafer, specifically to use circuits formed on silicon wafer to detect leakage current of depletion mode GaN transistor and then adjust gate voltage of depletion mode GaN transistor according to the detected leakage current.

BACKGROUND OF THE INVENTION

GaN is a key member of the third-generation semiconductor technology that is more and more important in recent years. Like the transistors formed on silicon wafer, the transistors formed on GaN wafer can be divided into the enhanced mode GaN transistor and the depletion mode GaN transistor. In general, these two mode GaN transistors can be operated at almost equivalent efficiency, but the cost of the enhanced mode GaN transistor is higher than that of the depletion mode GaN transistor. Anyway, since the threshold voltage (Vth) of the depletion mode GaN transistor is less than zero voltage, the depletion mode GaN transistor must be completely turned off by means of negative voltage driving to fully prevent the occurrence of leakage current in various commercial applications of the depletion mode GaN transistor.

Particularly, current GaN product usually include one or more GaN transistors formed on a GaN wafer for taking advantage of the wide energy gap of GaN material and one or more control circuits formed on a silicon wafer for utilizing existing designs for circuits formed on silicon material. That is to say, a depletion mode GaN product includes one or more depletion mode GaN transistors formed on a depletion mode GaN wafer and one or more control circuits formed on a silicon wafer. Moreover, the threshold voltage of the depletion mode GaN transistor is independent on the threshold voltage of the control circuit because they are formed on different wafer (different materials) via different fabrications respectively. Hence, the gate voltage of the control circuits and the gate voltage of the depletion mode GaN transistor are adjusted to their individual threshold voltage for fully preventing leakage current and reaching highest conversion efficiency at the same time respectively. In general, the value of threshold voltage of depletion mode GaN transistor is more negative than that of control circuits, even the value of threshold voltage of depletion mode GaN transistor is less stable than that of control circuits.

Further, due to at least material properties of GaN, not only life time of a depletion mode GaN transistor is significantly shorter than that of a silicon transistor with similar geometrical configuration, but also threshold voltage, leakage current or even other properties of a depletion mode GaN transistor is significantly unstable and easily varied and/or degraded with usage time and/or operating environment of the depletion mode GaN transistor. That is to say, problems induced by leakage current is significantly time-varying for depletion mode GaN transistor than that for control circuits.

Besides, due to at least material properties of GaN, different depletion mode GaN transistors designed to have same configuration and be formed by same fabrication still may have non-negligible leakage current differences. Such non-negligible differences usually are induced by inevitable practical differences between different batches of the same fabrication.

In addition, some current GaN transistors control method simply let the gate voltages of all depletion mode GaN transistors formed on a GaN wafer have same threshold voltage (a specific value of gate voltage) to ensure none of the depletion mode GaN transistors may have non-zero leakage current. Therefore, while using a single voltage to turn off all the depletion mode GaN transistors, it may encounter that the shutdown voltage is not negative enough to completely turn off all of the depletion-type GaN transistors and then some depletion GaN transistors unavoidably results in leakage current. Similarly, while using a single voltage to turn off all the depletion mode GaN transistors, it also may not be possible to obtain an optimal turn-off voltage, which will reduce the conversion efficiency during operation and even will affect the operation speed of the depletion mode GaN transistors. For example, in case of a number of depletion mode GaN transistors formed on a depletion mode GaN wafer having been in operation for a while, it is practical possible that some depletion mode GaN transistors still have the original threshold voltage −15 voltage and other depletion mode GaN transistors have the changed threshold voltage −13 voltage. In such situation, these current GaN transistors control methods have to let all depletion mode GaN transistors have gate voltage not higher than −15 voltages to ensure all of them may fully prevent leakage current. In such situation, some depletion mode GaN transistors can be turned on when the gate voltage is adjusted to be higher than −15 voltages but other depletion mode GaN transistors only can be turned on when the gate voltage is adjusted to be higher than −13 voltages. Hence, the former depletion mode GaN transistors and the latter depletion mode GaN transistors unavoidably have different operating speeds and different conversion efficiencies.

Note that there is no existing technology can be directly adopted now. For the conventional circuits formed on silicon wafer, all transistors are formed on same silicon wafer by using same fabrication. In this way, they have same threshold voltage and same leakage current, and their threshold voltages and leakage currents have almost no obvious differences induced by different usage periods or other different factors among them. Hence, they can be adjusted at the same time to minimize leakage current by calibrating their gate voltages to a same threshold voltage. Therefore, for conventional circuits formed on same silicon wafer, there is no reason and no requirement to develop any technology for minimizing different leakage currents among different transistors formed on same silicon wafer.

Accordingly, it is necessary to develop new technology for more effectively improving the leakage current problem of the depletion mode GaN transistors so as to further develop the commercial value of the depletion mode GaN transistors.

SUMMARY OF THE INVENTION

The invention is focused on how to eliminate the leakage current of the depletion mode transistor formed on the depletion mode GaN wafer, specifically on how to effectively eliminate the leakage current of the depletion mode GaN transistor in the GaN product composed of the silicon wafer and the depletion mode GaN wafer.

The invention utilizes the control circuit formed on a silicon wafer to detect the leakage current of a depletion mode GaN transistor formed on a depletion mode GaN wafer. The invention utilizes the control circuit formed on the silicon wafer to adjust gate voltage of the depletion mode GaN transistor formed on the depletion mode GaN wafer according to the detected leakage current. In this way, by repeatedly detecting leakage current and adjusting gate voltage accordingly, the gate voltage can be adjusted to be close enough to or even equal to a threshold voltage which just right block the leakage current. In this way, the leakage current problem on the depletion mode GaN transistors formed on the depletion mode GaN wafer can be solved by using the circuits formed on the silicon wafer.

Moreover, the transistor or other elements formed on silicon wafer is more stable than that formed on GaN wafer, and there are many mature circuit designs can be flexibly utilized to perform many functions. Hence, the control circuit formed on the silicon wafer can be used to improve the leakage current problem appeared on the depletion mode GaN wafer in one or more of the following situations: the depletion mode GaN transistor is operated first time (i.e., to setup), the depletion mode GaN transistor has been operated a certain number of times (i.e., to re-set), the depletion mode GaN transistor has been operated for a certain period of time (i.e. to re-set), the depletion mode GaN transistor has been operated under an extreme working condition (i.e., to calibrate), and an external Vth calibration command is received (i.e., to calibrate). Besides, the details of the control circuit are not limited, any existing, on-developing or to be appeared circuits capable of detecting leakage current and adjusting gate voltage accordingly can be utilized.

Some preferred embodiments are related to a depletion mode GaN transistor control circuit, which includes at least a current detecting module and a gate voltage adjusting module. The current detecting module is formed on a silicon wafer and configured to detect a leakage current of a depletion mode GaN transistor formed on a depletion mode GaN wafer, and the gate voltage adjusting module is formed on the silicon wafer and configured to adjust the gate voltage of the transistor according to the detected leakage current. Due to the properties of the depletion mode, the gate voltage adjusting module is configured to make the gate voltage more negative when the detected leakage current is larger than zero, or even to make the gate voltage to be a threshold voltage such that the transistor has just right a zero leakage current.

Further, these preferred embodiments may further include a gate voltage tracking module formed on the silicon wafer and configured to track the gate voltage of the depletion mode GaN transistor, such that the gate voltage adjusting module is configured to adjust the gate voltage of the depletion mode GaN transistor according to both the detected leakage current and the tracked gate voltage. Besides, these preferred embodiments may further include a controlling module formed on the silicon wafer and configured to operate both the current detecting module and the gate voltage adjusting module in one or more of situations listed above.

Moreover, these preferred embodiments many further have other options, because the invention need not to limit the details of the control circuit (i.e., need not to limit the practical designs of these modules listed herein). For example, the control circuit may further include a gate driver configured to provide a voltage of the gate of the depletion mode GaN transistor. The gate driver is connected to a voltage source and the voltage adjusting module. Hence, according to the variation of the output of the voltage adjusting module, the voltage provided to the gate of the depletion mode GaN transistor is modified accordingly. For example, the gate voltage adjusting module may include a voltage source configured to provide a fixed voltage to the gate of the depletion mode GaN transistor and a negative voltage converter configured to provide a negative voltage according to the detected current to the gate of the depletion mode GaN transistor. Thus, the gate voltage of the depletion mode GaN transistor is decided by the combination of the fixed voltage and the negative voltage. For example, the gate voltage adjusting module may include a negative voltage converter configured to provide a negative voltage less than the tracked gate voltage to the gate of the depletion mode GaN transistor so as to update the gate voltage of the depletion mode GaN transistor. The details of the negative voltage converter are not limited. Indeed, for circuits formed on silicon wafer, there are many well-known skills for generating negative voltage, such as charge pump and inverting buck-boost. For example, the current detecting module may include an adjustable current mirror for duplicating and enlarging the leakage current such that the gate voltage adjusting module is configured to adjust the gate voltage of the depletion mode GaN transistor according to directly an enlarged detected leakage current.

Furthermore, these preferred embodiments do not limit the geometrical relation between the depletion mode GaN transistor control circuits and the depletion mode GaN transistors. For example, the silicon wafer having one or more control circuits and the depletion mode GaN wafer having one or more depletion mode GaN transistors can be packaged together as a bare die. For example, the silicon wafer having one or more control circuits and the depletion mode GaN wafer having one or more depletion mode GaN transistors can be packaged separately as two different bare dies, wherein the two different bare dies can be electrically connected. For example, the depletion mode GaN transistor control circuits can be fixedly embedded in the printed circuit board and the depletion mode GaN wafer having one or more depletion mode GaN transistors can be flexibly connected to one or more slots on the printed circuit board.

Some preferred embodiments are related to a depletion mode GaN product, which includes one or more depletion mode GaN transistors formed on a depletion mode GaN wafer and one or more control circuit formed on a silicon wafer. For example, the packaged together bare die mentioned above. The control circuit and the depletion mode GaN transistors are paired one-to-one with each other. In each pair, the control circuit is configured to detect leakage current of the depletion mode GaN transistor and then adjust gate voltage of the depletion mode GaN transistor accordingly. In addition, the currently popular commercial GaN bare die includes a depletion mode GaN transistor formed on a depletion mode GaN wafer and a control circuit formed on a silicon wafer. Anyway, these embodiments may include other kinds of GaN products.

Apparently, the control circuit in these preferred embodiments correspond to the depletion mode GaN transistor control circuit described on above paragraphs. Hence, the relevant details are not repeatedly described herein.

Some preferred embodiments are related to a depletion mode GaN transistor optimization method. Initially, pair one or more control circuits and one or more depletion mode GaN transistors one-to-one with each other, wherein the depletion mode GaN transistors are formed on a depletion mode GaN wafer and the control circuits are formed on a silicon wafer. And then, operate at least one pair of control circuit and depletion mode GaN transistor to perform the following steps in sequence: applying a gate voltage to a gate of the depletion mode GaN transistor by using the control circuit, detecting a leakage current of the depletion mode GaN transistor by using the control circuit, adjusting the gate voltage according to the detected leakage current by using the control circuit, and repeating the above steps until the detected leakage current is not larger than a specific value or even is zero.

One option is to repeat the steps until the detected leakage current is equal to the specific value, and another option is to adjust the gate voltage to be more positive when the detected leakage current is zero until the new detected leakage current corresponding to the adjusted gate voltage is larger than zero but not larger the specific value. Ideally, the specific value is zero, although the specific value can be larger than but close to zero in some practical situations.

Besides, the method can be viewed as the operation method of both the depletion mode GaN transistor control circuit and the depletion mode GaN product described above. Hence, the relevant hardware details are not repeatedly described herein. Note that different pairs can be operated respectively (or viewed as different depletion mode GaN transistors can be operated respectively). Hence, depending on different practical requirements, the proposed method can be used to setup or reset whole depletion mode GaN product, to calibrate only partial GaN product, and or even to adjust the gate voltages of different depletion mode GaN transistors respectively when different depletion mode GaN transistors have different detected leakage currents.

DETAILED DESCRIPTION OF THE INVENTION

The detailed description and preferred embodiments of the invention will be set forth in the following content, and provided for people skilled in the art to understand the characteristics of the invention.

Figure 1A:
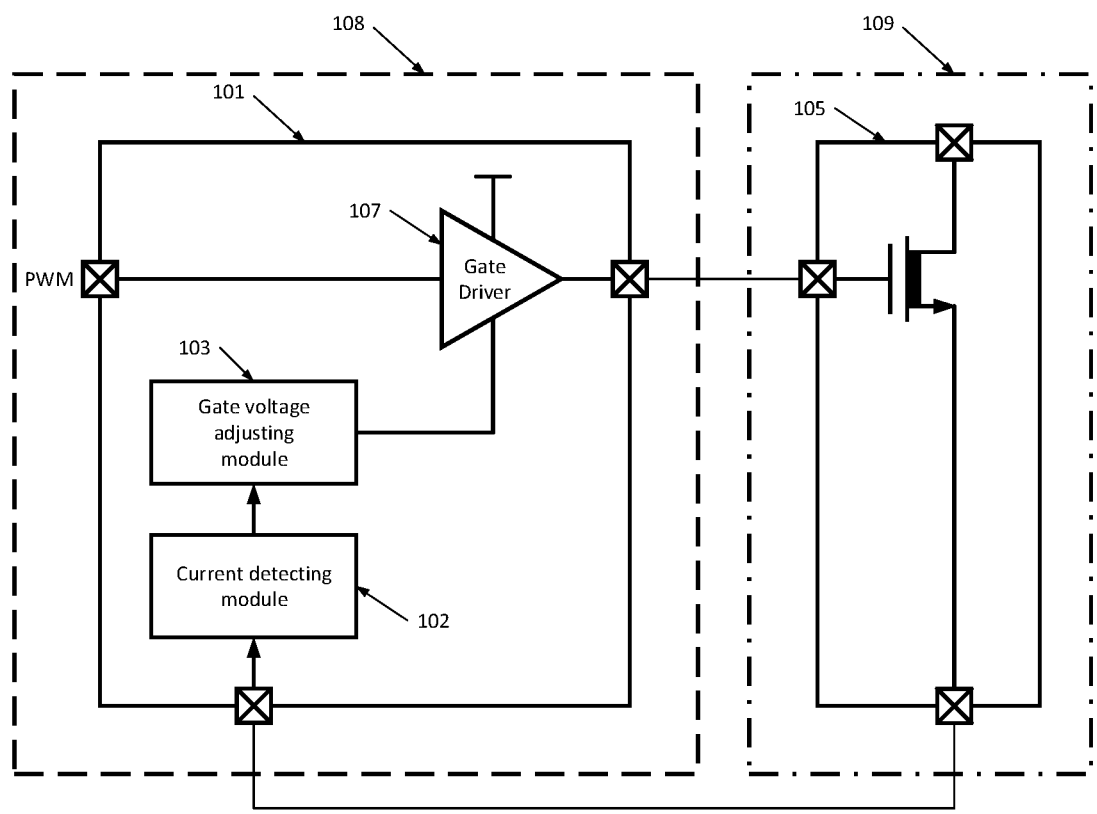
FIG. 1A to FIG. 1C are some functional block diagram according to some embodiments of the invention.

Refer to FIG. 1A which is a functional block diagram according to some embodiments of the invention. As shown in FIG. 1A, the proposed depletion mode GaN transistor control circuit 101 includes at least a leakage current detecting module 102 and a gate voltage adjusting module 103. The leakage current detecting module 102 is formed on a silicon wafer 108 and configured to detect a leakage current of a depletion mode GaN transistor 105 formed on a depletion mode GaN wafer 109, and the gate voltage adjusting module 103 formed on the silicon wafer 108 and configured to adjust the gate voltage of the transistor according to the detected leakage current. Hence, the leakage current detecting module 102 is electrically connected to the source of the depletion mode GaN transistor 105 and the gate voltage adjusting module 103 is electrically connected to the gate of the depletion mode GaN transistor 105 via the gate driver 107. The gate driver 107 receives an input voltage and the operation of the gate driver 107 is adjusted to according to the output of the gate voltage adjusting module 103. Hence, the voltage outputted by the gate driver 107 to the gate of the depletion mode GaN transistor 105 is a function of both the input voltage and the output, and then the gate voltage of the depletion mode GaN transistor 105 can be adjusted according to its leakage current via the operation of both the leakage current detecting module 102 and the gate voltage adjusting module 103. The usage of the gate driver 107 is a popular way to adjust the gate of a transistor, but the details of the depletion mode GaN transistor control circuit 101 is not limited thereby. Indeed, whether to use the gate driver 107 or to use other well-known circuit design for adjusting the gate voltage of the depletion mode GaN transistor control circuit 101 according to the output of the gate voltage adjusting module 103 are acceptable for the proposed invention. Besides, the geometrical relation between the silicon wafer 108 and the depletion mode GaN wafer 109 need not be limited herein. For example, they can be packaged together as a bare die or be packaged separately as two bare dies.

Figure 1B:
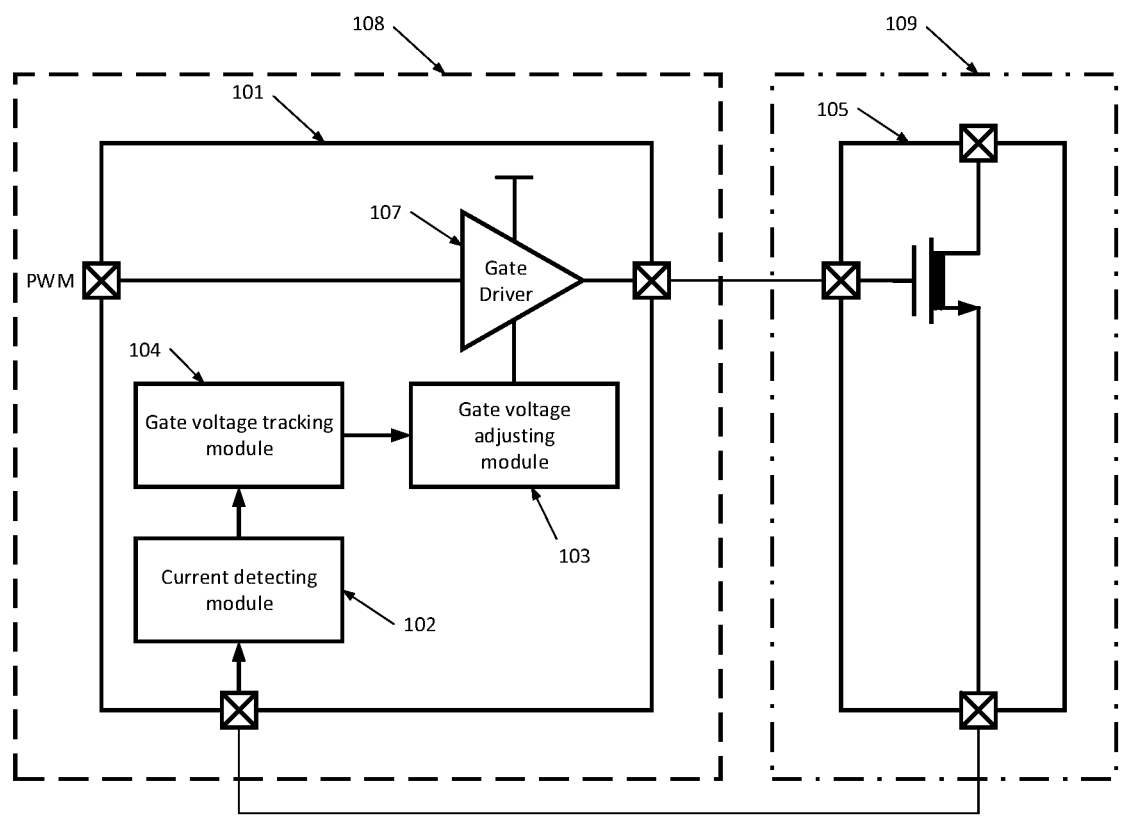

Refer to FIG. 1B which is a functional block diagram according to some similar embodiments of the invention. As shown in FIG. 1B, a gate voltage tracking module 104 is formed on the silicon wafer 108 and configured to track the gate voltage of the depletion mode GaN transistor 105, wherein the gate voltage adjusting module 103 is configured to adjust the gate voltage of the depletion mode GaN transistor 105 according to both the detected leakage current and the tracked gate voltage. Again, the popularly used gate deriver 107 is used to output voltage to the gate of the depletion mode GaN transistor 105 in reference to the operation of the gate voltage adjusting module 103.

In general, when non-zero leakage current is detected, the recently existing gate voltage of the depletion mode GaN transistor 105 is no doubt higher than the threshold voltage which just allowing no leakage current, Hence, it is reasonable to make the gate voltage more negative (i.e., reduce the gate voltage) when a non-zero leakage current is detected. Similarly, when no leakage current is detected (i.e., the magnitude of leakage current is zero), the recently gate voltage of the depletion mode GaN transistor 105 can be equal to the threshold voltage (or viewed as the difference it and the threshold voltage is almost zero) or be lower than significantly the threshold voltage which induces non-negligible slower reaction rate and lower efficiency. Hence, it is reasonable to make the gate voltage more positive when no leakage current is detected. Of course, the best target is to make the gate voltage right to be the threshold voltage, hence the gate voltage can be more negative and more positive repeatedly to ensure the gate voltage has been adjusted to be equal to or at least close enough to the threshold voltage.

In this way, one option is that reduce the gate voltage a fixed amount whenever a non-zero leakage current is detected. For example, whenever a non-zero leakage current is detected, reduces gate voltage –0.5 voltage automatically.

In this way, another option is that adjust the gate voltage a specific amount according to the magnitude of the detected leakage current. For example, reduces the gate voltage –0.5 voltage whenever 0.05 amps of leakage current is detected but reduces the gate voltage –1.5 voltage whenever 0.15 amps of leakage current is detected.

In this way, one more option is that adjust the recent gate voltage value to a new gate voltage value according to both the magnitude of detected non-zero leakage current and the recent value of the tracked gate voltage. For example, whenever non-zero leakage current is detected and the recent value of the gate voltage is −12 voltage, adjust the gate voltage by reducing the gate voltage a fixed amount −1 voltage to a new value −13 voltage. For example, whenever the detected leakage current has a magnitude 0.15 amps and the recent value of the gale is −12 voltage, adjust the gate voltage a specific amount according to the magnitude 0.15 amps to a new value −12.5 voltage. For example, whenever the detected leakage current has a magnitude 0.45 amps and the recent value of the gale is −12 voltage, adjust the gate voltage a specific amount according to the magnitude 0.45 amps to a new value −13.5 voltage.

In these embodiments, due to the existences of numerous mature circuit designs on silicon wafer for performing various functions maybe directly referenced, both the leakage current detecting module 102 and the gate voltage adjusting module 103 can be simplified practiced. Indeed, for any transistor formed on silicon wafer, it is also necessary to detect leakage current for confirming whether the gate voltage has been setup well and to adjust value of the gate voltage to a specific threshold voltage if non-zero leakage current is detected. Hence, these circuit designs for detecting leakage current (or viewed as detecting current) and for adjusting gate voltage according to detected leakage current (or viewed as generating a voltage according to detected current) can be directly referenced. In other words, the detailed designs of these modules are not limited. Again, without duplicated explanation, the details of the gate voltage tracking module 104 are not limited because these circuit designs for tracking the variation of voltage on a specific position are well-known.

In addition, due to at least the property differences between silicon and GaN, the feature of the circuits formed on the silicon wafer are stable significantly than the features of the transistors formed on the depletion mode GaN wafer, and then the invention may use more stable depletion mode GaN transistor control circuit 101 to calibrate less stable depletion mode GaN transistor 105 during the operation period of the depletion mode GaN Transistor 105.

In some exemplary embodiments, to more effectively adjust the gate voltage, the leakage current detecting module 102 includes an adjustable current mirror for duplicating and enlarging the current from the detected depletion mode GaN transistor such that the gate voltage adjusting module 103 is configured to adjust the gate voltage of the depletion mode GaN transistor according to directly the enlarged detected leakage current.

In some exemplary embodiments, to more regularly adjust the gate voltage, the gate voltage adjusting module 103 includes a negative voltage converter configured to provide a negative voltage less than the tracked gate voltage directly to the gate of the depletion mode GaN transistor 105 so as to update the gate voltage of the depletion mode GaN transistor 105. Thus, the function of the gate driver 107 is incorporated into the function of the gate voltage adjusting module 103. Hence, the gate voltage may by updated when the currently existing gate voltage allows the existence of a non-zero leakage current, and the adjustment degree of the gate voltage is unique. For example, when the currently existing gate voltage is −11 voltage and a non-zero leakage current is detected, the negative voltage converter may provide a −1 voltage to the gate of the depletion mode GaN transistor 105 for updating the current existing gate voltage to a newly updated gate voltage −12 voltage.

In some exemplary embodiments, to more regularly adjust the gate voltage, the gate voltage adjusting module 103 includes both a voltage source configured to provide a fixed voltage directly to the gate of the depletion mode GaN transistor 105 and a negative voltage converter configured to provide a negative voltage according to the detected current directly to the gate of the depletion mode GaN transistor 105. It can be viewed as that the gate driver 107 is integrated into the gate voltage adjusting module 103. Hence, the gate voltage can be updated when the currently existing gate voltage allows the existence of a non-zero leakage current, and also the adjustment degree of the gate voltage is positively feedback. For example, when the currently existing gate voltage is −11 voltage and the voltage source constantly provides a fixed −10 voltage to the gate, if the non-zero leakage current induces a −0.1 voltage or a −0.2 voltage respectively then the negative voltage converter may provide a −1.5 voltage or a −3 voltage to the gate of the depletion mode GaN transistor 105 for updating the gate voltage to −11.5 voltage or −13 voltage.

Surely, depending on how negative voltage converter responses to the detected leakage current, the details of the negative voltage converters used in two kinds of previous exemplary examples are different. For example, the negative voltage converter can be an inverting buck-boost converter (IBB converter) which can be used to provide a negative rail from a positive supply with a common ground connection. For example, the negative voltage converter can be a charge pump which uses a capacitor as an energy storage element and is popularly used to generate a negative output voltage in response to the input voltage. Indeed, there are many well-known skills to generate a negative voltage according to the input voltage, and the invention need not to limit these relevant details.

Figure 1C:
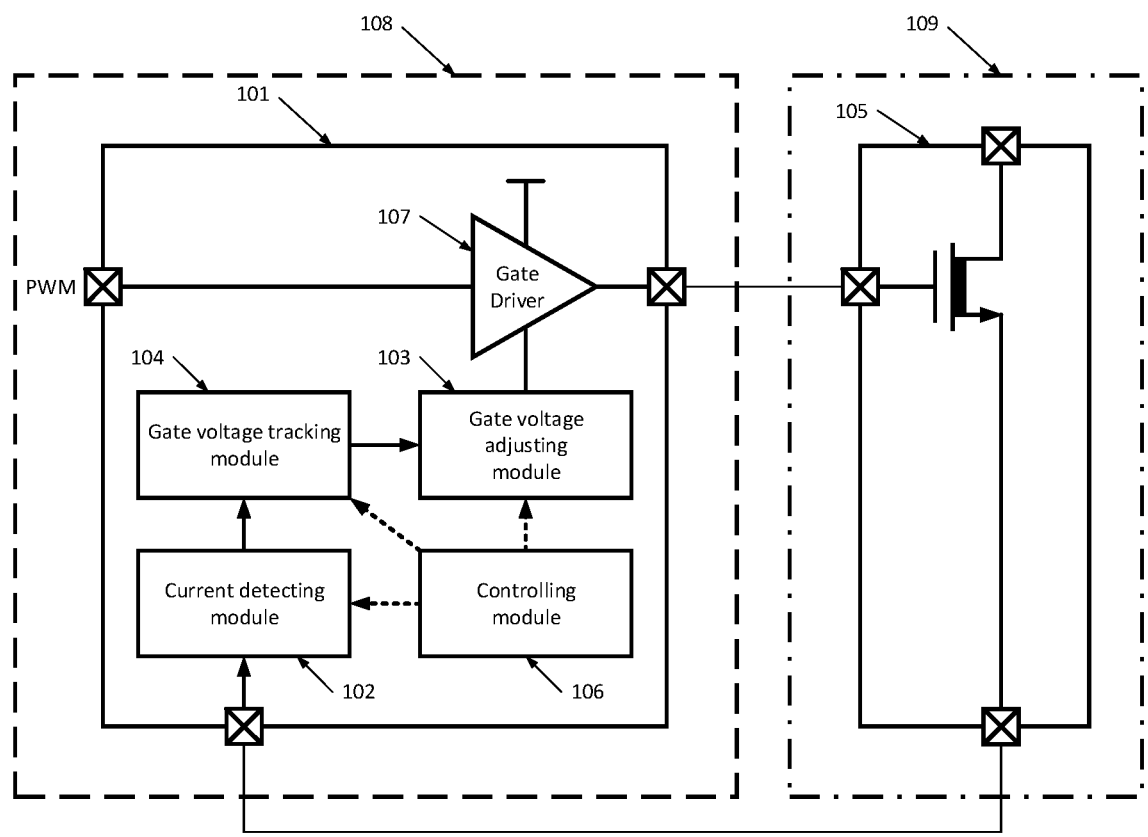

In some exemplary embodiments, to more regularly, more timely, and/or more flexibly adjust the gate voltage in response to various practical situations, as shown in FIG. 1C which is a functional block diagram according to some similar embodiments of the invention, the depletion mode GaN transistor control circuit 101 may include a controlling module 106 formed on the silicon wafer 108 and configured to operate both the leakage current detecting module 102 and the gate voltage adjusting module 103 in one or more of the practical situations. For example, to initially setup the gate voltage for precisely eliminating leakage current before the depletion mode GaN transistor 105 is operated for the first time. For example, to calibrate the gate voltage for eliminating any gate voltage variation after the depletion mode GaN transistor 105 has been operated a certain number of times. For example, to calibrate gate voltage for eliminating any gate voltage variation after the depletion mode GaN transistor 105 has been operated for a certain period of time. For example, to confirm and correct the gate voltage for eliminating any leakage current again after the depletion mode GaN transistor 105 has been operated under an extreme working condition, such as high temperature environment or unstable power supply. For example, to calibrate the gate voltage again when an external Vth calibration command is received no matter what the depletion mode GaN transistor 105 has experienced. Clearly, the controlling module 106 is related to when and under what circumstances to detect leakage current and then adjust gate voltage accordingly, but is nothing about what kind of circuits being used to adjust the gate voltage of the depletion mode GaN transistor 105 according to the detected leakage current.

Figure 2A:
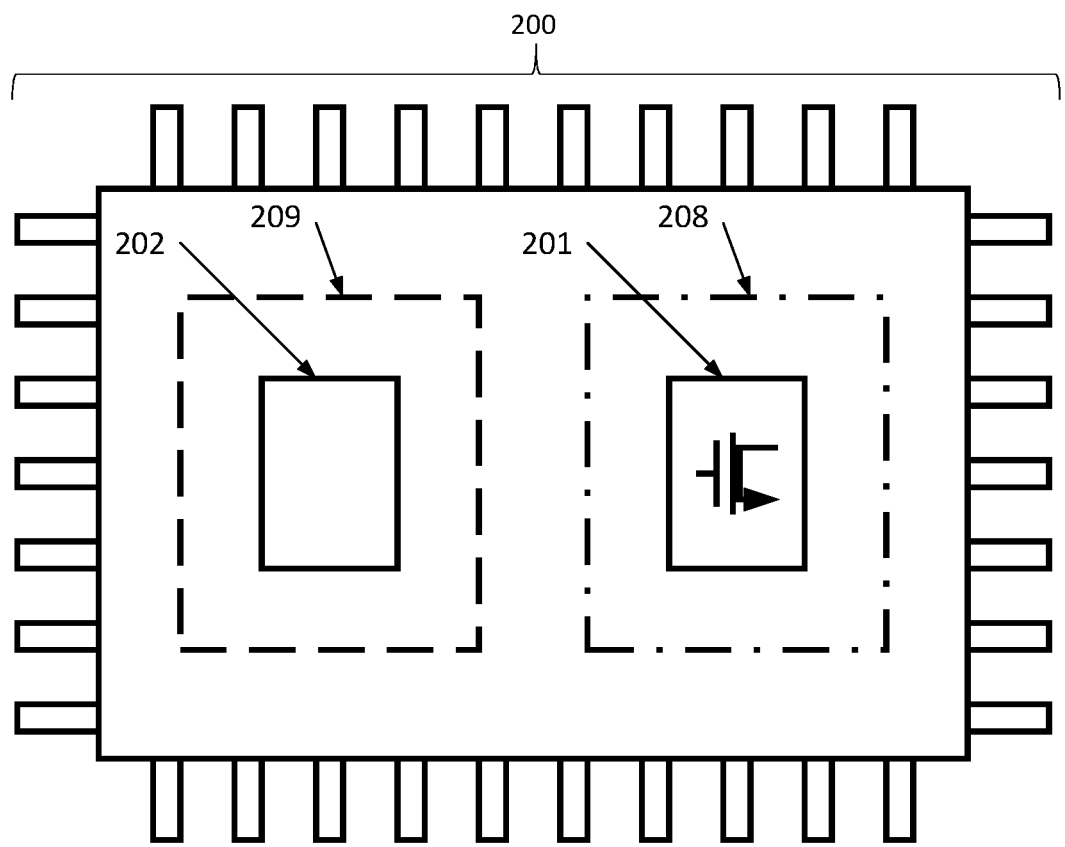
FIG. 2A and FIG. 2B are two schematic diagrams according to some embodiments of the invention respectively.
Figure 2B:
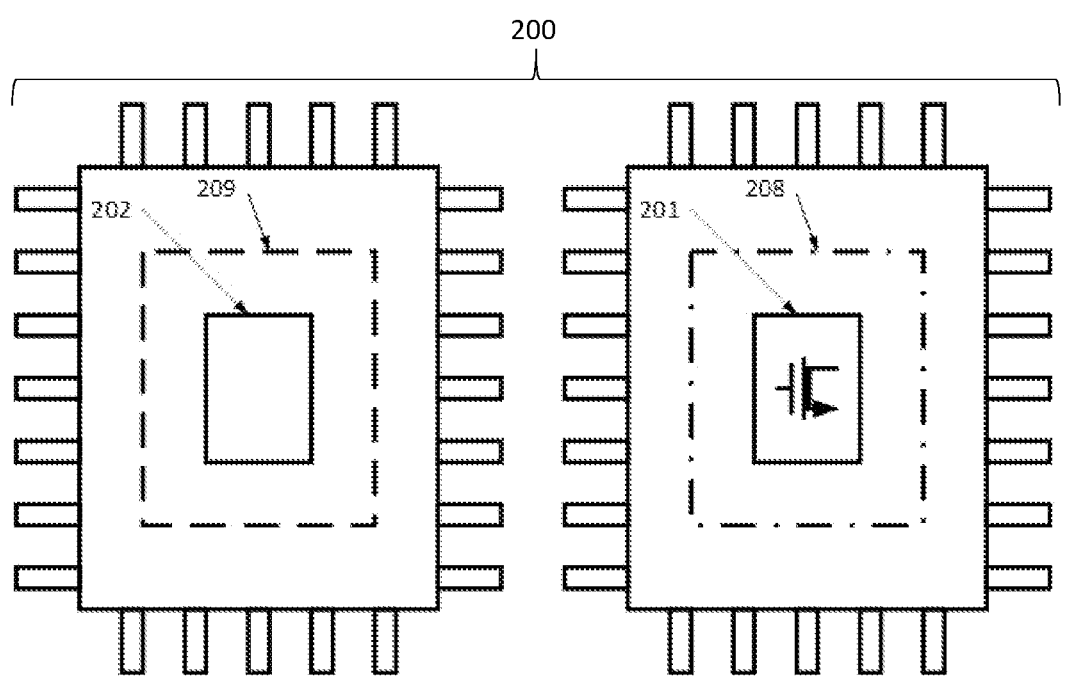

Refer to FIG. 2A and FIG. 2B, which are schematic diagrams according to some embodiments of the invention respectively. As shown in FIG. 2A and FIG. 2B, the proposed depletion mode GaN product 200 includes a depletion mode GaN transistor 201 formed on a depletion mode GaN wafer 208 and a control circuit 202 formed on a silicon wafer 209. The control circuit 202 is configured to detect leakage current of the depletion mode GaN transistor 201 and then adjust the gate voltage of the depletion mode GaN transistor 201 accordingly. Moreover, the depletion mode GaN wafer 208 having the depletion mode GaN transistor 201 and the silicon wafer 209 having the control circuit 202 can be packaged together as a chip as shown in FIG. 2A or packaged separately as two chips as shown in FIG. 2B, the only two requirements are that the control circuit 202 is electrically connected to the depletion mode GaN transistor 202 and that the connections therebetween are protected well. Since there are many commercial package skills for packaging the depletion mode GaN wafer 208 and the silicon wafer 209, these details of packaging the proposed depletion mode GaN product 200 are not limited.

Reasonably, the control circuit 202 can be the depletion mode GaN transistor control circuit 101 present above, because they have same functions and same configurations. Therefore, the details of the control circuit 202, such as the hardware configurations and the corresponding operations, need not to be duplicated herein.

Moreover, some similar embodiments are depletion mode GaN product including a number of depletion mode GaN transistors 201 formed on the depletion mode GaN wafer 208 and a number of control circuits 202 formed on the silicon wafer 209. Again, they can be packaged together or separately. These control circuits 202 and these depletion mode GaN transistors 201 are paired one-to-one with each other, these control circuits 202 are separated mutually and these depletion mode GaN transistors are separated mutually, and each control circuit 202 detects leakage current of the paired depletion mode GaN transistor 201 and then adjusts gate voltage of the paired depletion mode GaN transistor 201 accordingly. Further, different pairs can be operated respectively because they are independent mutually. Hence, different depletion mode GaN transistors 201 can be checked/calibrated separately according to their individual situations. For example, in case that only a portion of these depletion mode GaN transistors 201 have been operated frequently during a specific period, their gate voltages can be changed more significantly than the gate voltage of other portions of these depletion mode GaN transistors 201. Hence, it can be benefit to particularly use their paired control circuits 202 to adjust their gate voltages correspondingly.

Figure 3A:
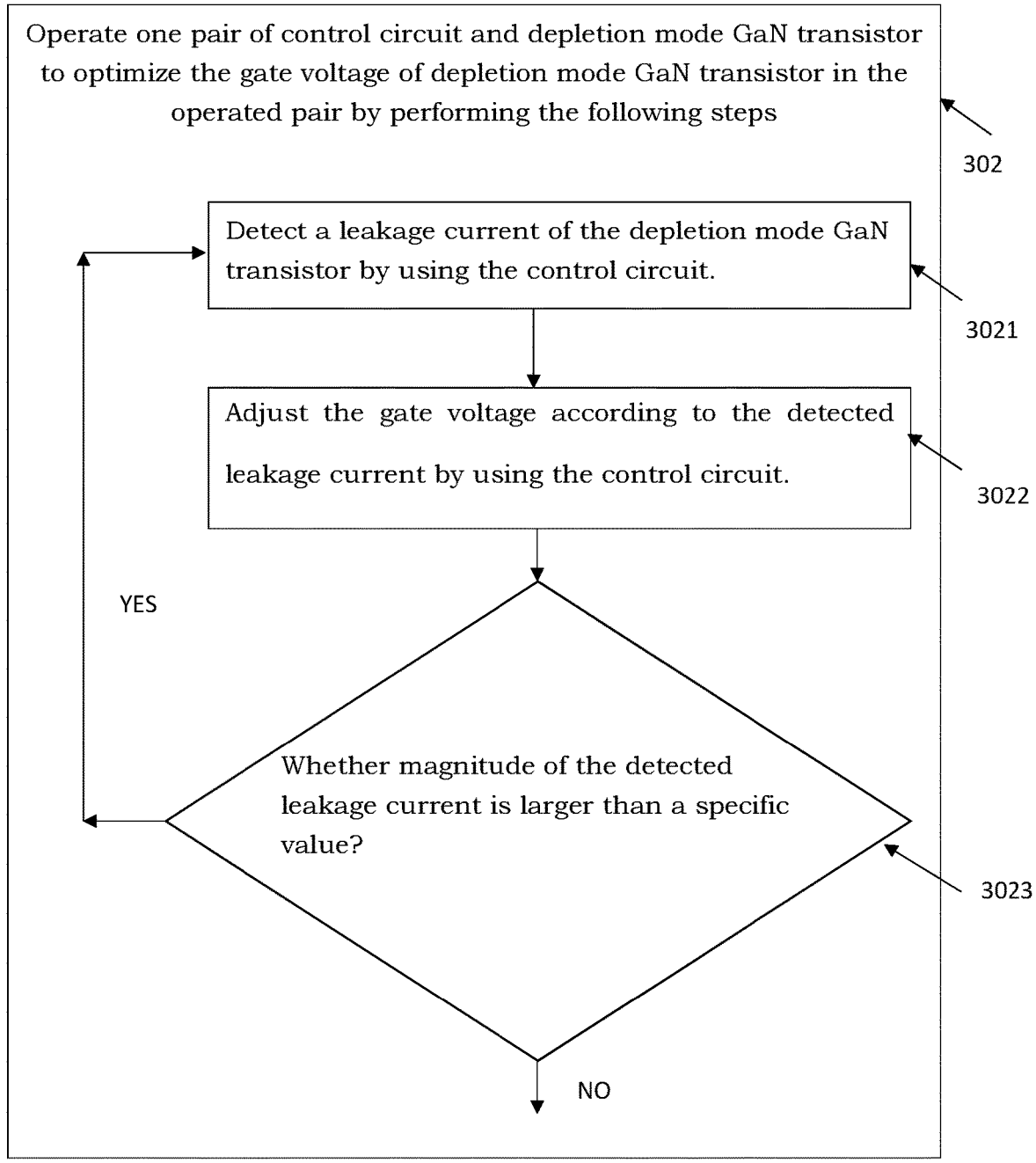
FIG. 3A is a flowchart according to some embodiments of the invention.

Refer to FIG. 3A which is a flowchart according to some embodiments of the invention. As shown in FIG. 3A, the proposed depletion mode GaN transistor optimization method include essentially the following steps. Initially, as shown in block 301, pair one or more control circuits and one or more depletion mode GaN transistors one-to-one with each other, wherein the depletion mode GaN transistors are formed on a depletion mode GaN wafer and the control circuits are formed on a silicon wafer. Next, as shown in block 302, operate one pair of control circuit and depletion mode GaN transistor to optimize the gate voltage of depletion mode GaN transistor in the operated pair by performing the following steps: as shown in block 3021, detect a leakage current of the depletion mode GaN transistor by using the control circuit; as shown in block 3022, adjust the gate voltage according to the detected leakage current by using the control circuit; and as shown in block 3023, repeat the above steps when magnitude of the detected leakage current is larger than a specific value and stopping repeating the above steps when magnitude of the detected leakage current is not larger than the specific value.

Clearly, by performing block 302 two or more times in sequence or simultaneously, two or more pairs can be optimized to minimize or even eliminate non-zero leakage current. In this way, these depletion mode GaN transistors formed on the same depletion mode GaN wafer can be totally or partially calibrated to adjust their recently existing gate voltages to their threshold voltages respectively. Note that by operating different pairs respectively, different pairs can be adjusted to have different gate voltages. Thus, when the features of different depletion mode GaN transistors have been varied differently to have different threshold voltages respectively although they had equivalent threshold voltage at the initial setting, the proposed method may calibrate all of them to have their individual recent threshold voltage.

In ideal situation, the steps are repeated until the gate voltage is adjusted to be a threshold voltage such that the depletion mode GaN transistor has right a zero leakage current without reducing the reaction speed and degrading efficiency. Anyway, in real situation, it is optional to stop repeating the steps if the gate voltage is adjusted to only allow a leakage current having almost zero magnitude (i.e., magnitude of the detected leakage current is not larger than an almost zero value).

Optionally, the gate voltage is adjusted to be more negative when a non-zero leakage current is detected to approach the threshold voltage of the depletion mode GaN transistor, because the threshold voltage of a depletion mode GaN transistor is less than zero and the commercial depletion mode GaN transistor usually has a threshold voltage about −10 voltages to −20 voltages. Also optionally, the gate voltage is adjusted to be more positive when a zero leakage current is detected to approach the threshold voltage of the depletion mode GaN transistor, because any gate voltage less than the threshold voltage may induce zero leakage current but also reduce the reaction rate and degrade efficiency. That is to say, it is optional to continuously make the gate voltage more negative or more positive when the recently existing gate voltage is far away the threshold voltage, but it is also optional to staggered make the gate voltage negative and positive if the recently existing gate voltage is close to the threshold voltage.

Optionally, as discussed above, the invention may adjust the gate voltage a certain amount each time or may decide the adjustment amount according to the magnitude of detected leakage current. Hence, it is optional to decrease the gate voltage by a first specific fixed value whenever a non-zero leakage current is detected, to increase the gate voltage by a second specific fixed value whenever a zero leakage current is detected, and/or to decrease gate voltage according to the magnitude of the detected non-zero leakage current. Of course, the first specific fixed value can be independent on the second specific fixed value.

Optionally, as discussed above, the invention may calibrate one or more depletion mode GaN transistors to minimizer and/or eliminate the non-zero leakage current in one or more of practical situations. Hence, it is optional to adjust the gate voltage of at least one pair to initially setup whenever one or more depletion mode GaN transistors are operated first time, to middle-term calibrate whenever one or more depletion mode GaN transistors have been operated a certain number of times, for a certain period of time and/or under an extreme working condition, and to adjust per request whenever an external Vth calibration command is received.

Figure 3B:
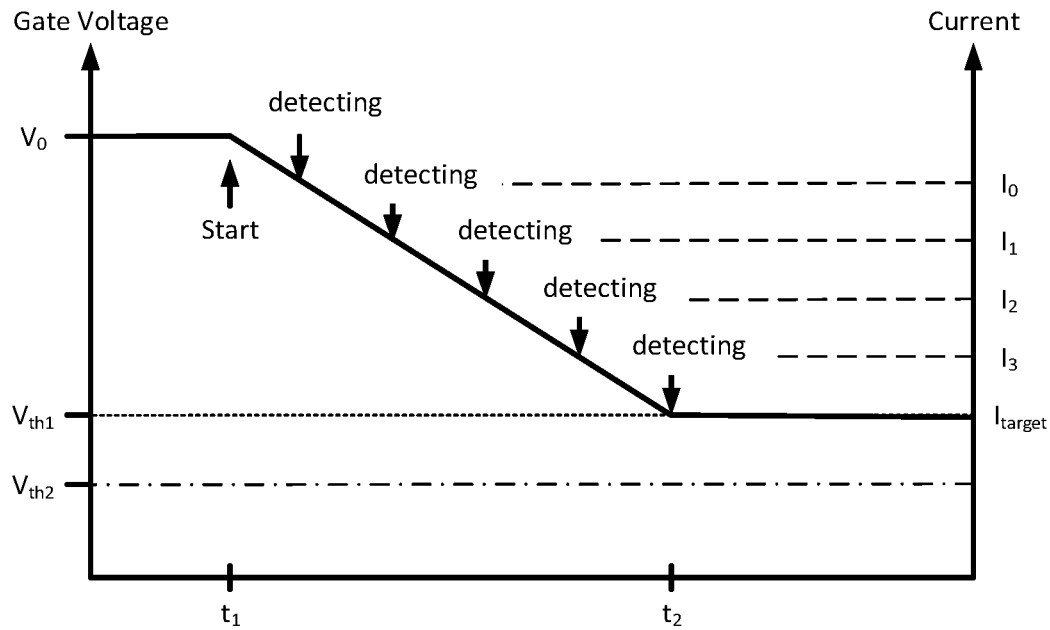
FIG. 3B to FIG. 3F present the features of the proposed invention and the differences from some conventional technologies according to some embodiments of the invention.
Figure 3C:
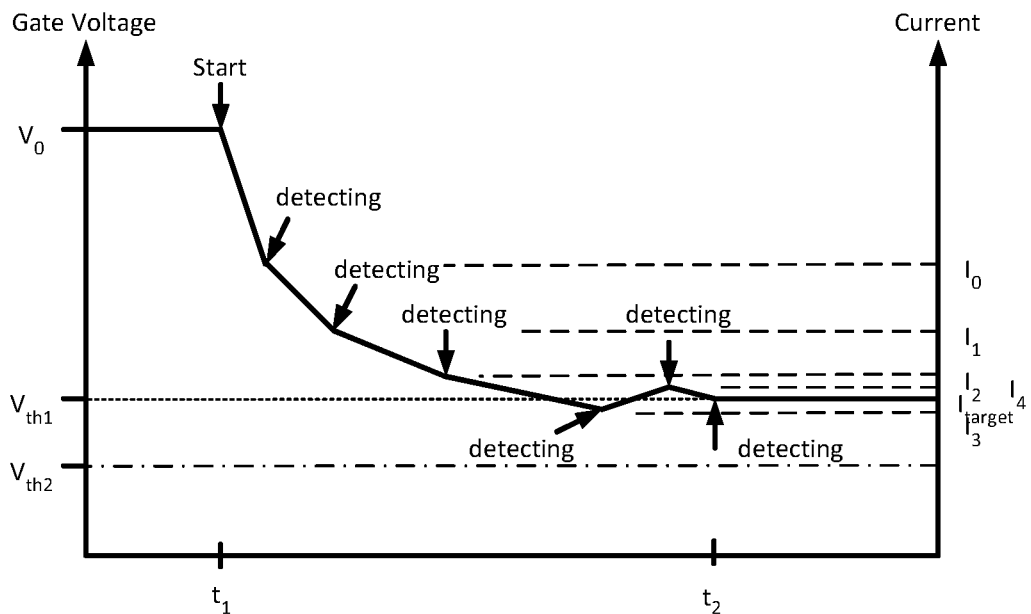
Figure 3D:
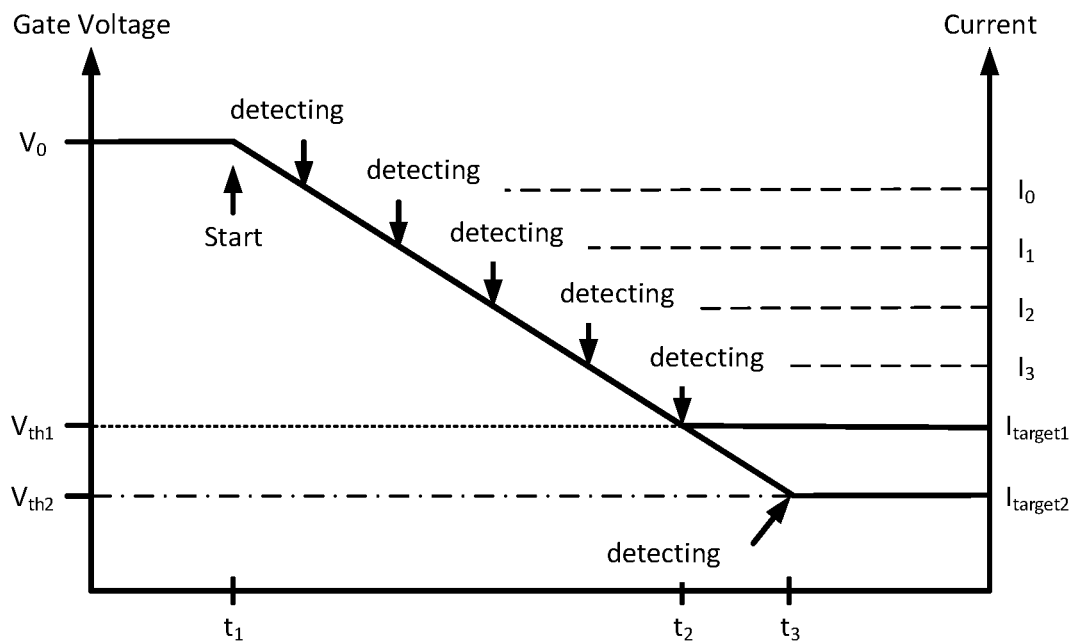
Figure 3E:
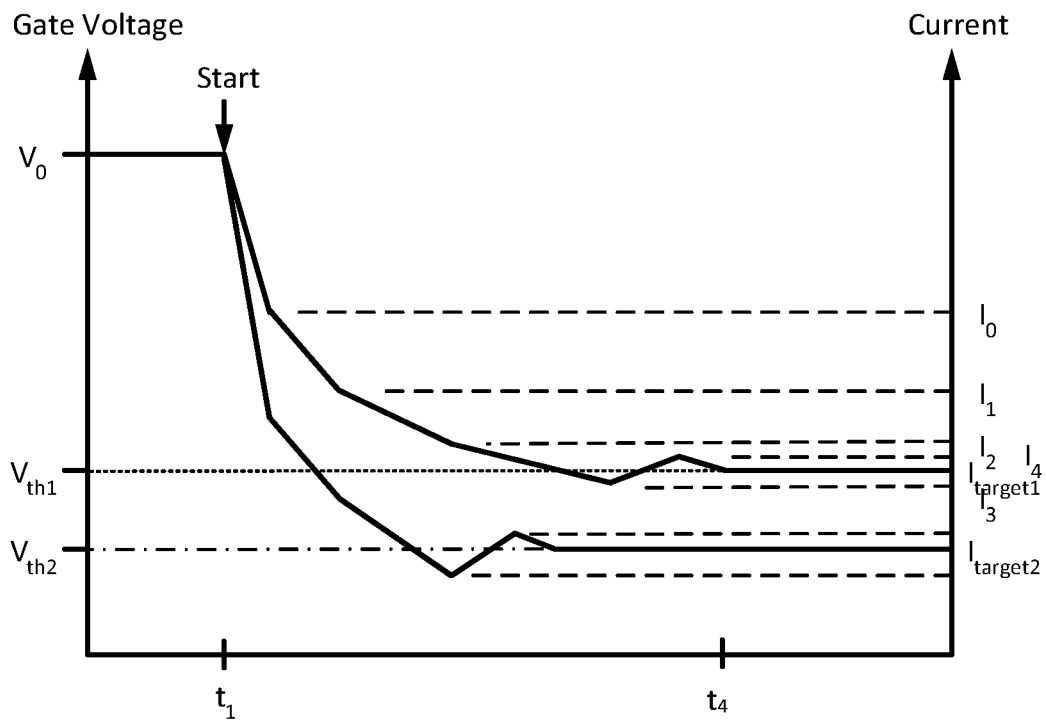
Figure 3F:
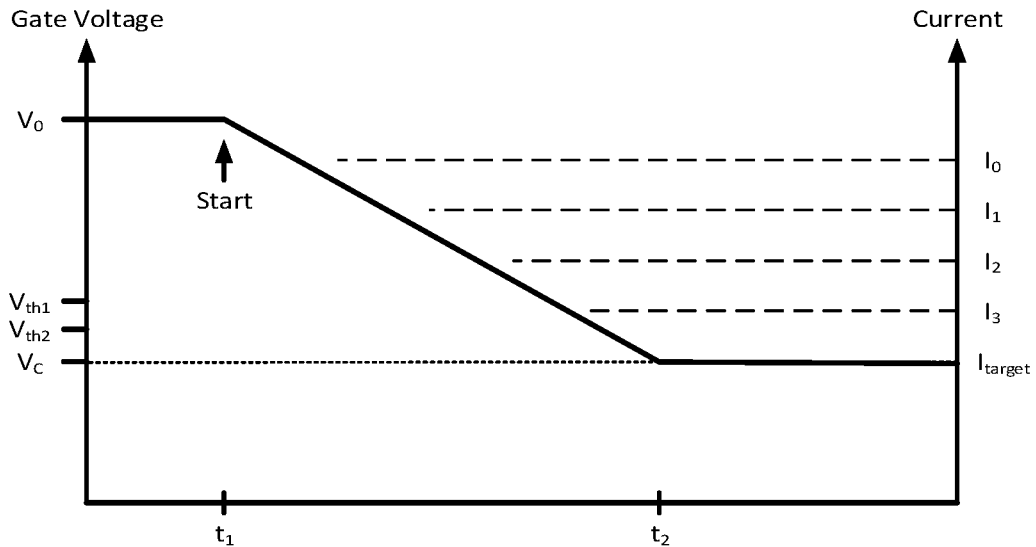

FIG. 3B to FIG. 3F present the features of the proposed invention and the differences from some conventional technologies according to some embodiments of the invention. FIG. 3B qualitatively illustrates how the proposed method adjusts the gate voltage to the appropriate threshold voltage. From time t0 to time t1, the depletion mode GaN transistor is powered and an initial voltage value Vo is applied as the initial gate voltage. From time t1 to time t2, by repeatedly detecting the leakage current and then reducing the gate voltage a fixed amount when non-zero currents $I_0$, $I_1$, $I_2$ and $I_3$ are detected in sequence, the gate voltage is lowed to the threshold voltage Vth just enough to make the leakage current zero (or viewed as the leakage current is not larger than a target current $I_{target}$). Then, after t2, by fixing the gate voltage at the threshold voltage, the depletion mode GaN transistor can be normally operated. FIG. 3C also qualitatively illustrates how the proposed method adjusts the gate voltage to the appropriate threshold voltage, and the differences from FIG. 3B are that repeatedly detecting the leakage current and then reducing the gate voltage an amount proportion to the magnitude of the detected current ($I_0$, $I_1$, $I_2$ $I_3$, and $I_4$) correspondingly from time t1 to time t2. Note that the gate voltage has been reduced to be lower than the threshold voltage but is finally increased back to be almost equal to the threshold voltage (i.e., the detected leakage is step by step adjusted to be the not larger than a target current $I_{target}$). Clearly, FIG. 3B and FIG. 3C are just two method examples of the invention but not limit these possible variations of the invention. Moreover, FIG. 3D qualitatively illustrates the situation that two depletion mode GaN transistors have their own threshold voltages Vth1 and Vth2 respectively. In this situation, the two transistors have equivalent initial gate voltage $V_0$ at time $t_0$, and the gate voltage is adjusted to Vth1 at time t2 and Vth2 at time t3 successively because the gate voltage is reduced by a fixed amount voltage whenever a non-zero leakage current is detected. Further, FIG. 3E qualitatively illustrates the situation that two depletion mode transistors have their own threshold voltages Vth1 and Vth2 respectively. In this situation, the two transistors have equivalent initial gate voltage V0 at time t0, but their gate voltages are adjusted to their individual threshold voltages Vth1 and Vth2 at time $t_4$ simultaneously because the gate voltage is lowered by an amount proportional to the magnitude of the non-zero detected current. Note that the magnitude of the leakage current is proportion to the differences between its' recent gate voltage and its' threshold voltage. In other words, by properly adjusting the proportional relationship between the gate voltage adjustment amount and the detected current value respectively, it is possible that different transistors are adjusted to have their own threshold voltages at the same time. In contrast, FIG. 3F qualitatively illustrates the conventional skills that all depletion mode GaN transistors are adjusted to have a common gate voltage (Vc) not larger than both Vth1 and Vth2 to ensure all depletion mode GaN transistors have no leakage current. Significantly, by using the conventional skills, at least one depletion mode GaN transistor is not operated with fastest reaction speed and highest efficiency because its gate voltage is not adjusted to be its threshold voltage. In contrast, by using this invention, both depletion mode GaN transistors can be operated with (or almost with) fastest reaction speed and highest efficiency because their gate voltages are adjusted individually to their threshold voltages (i.e., Vth1 and Vth2) respectively.

Figure 4A:
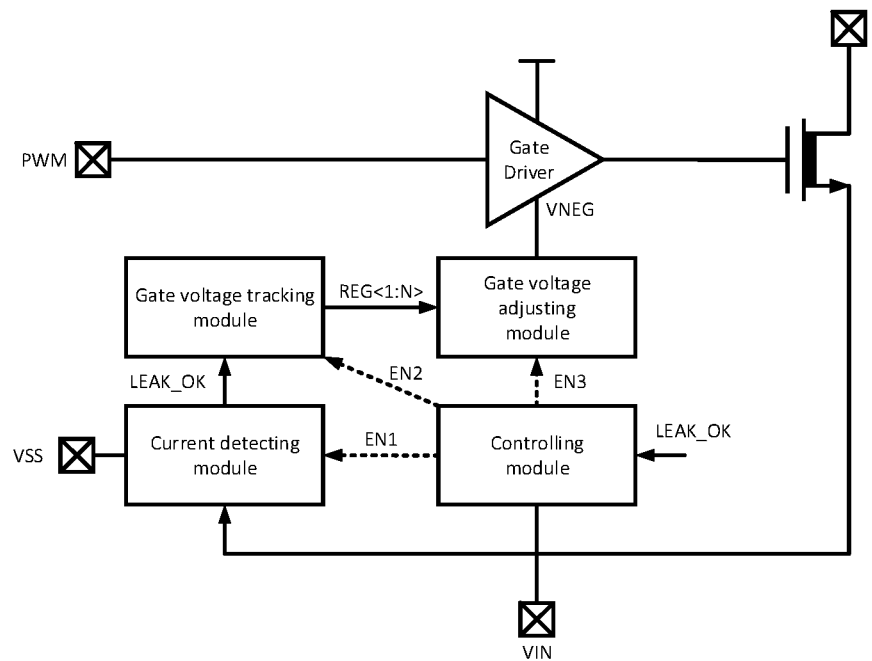
FIG. 4A and FIG. 4B are circuit diagram and timing diagram according to some embodiments respectively.
Figure 4B:
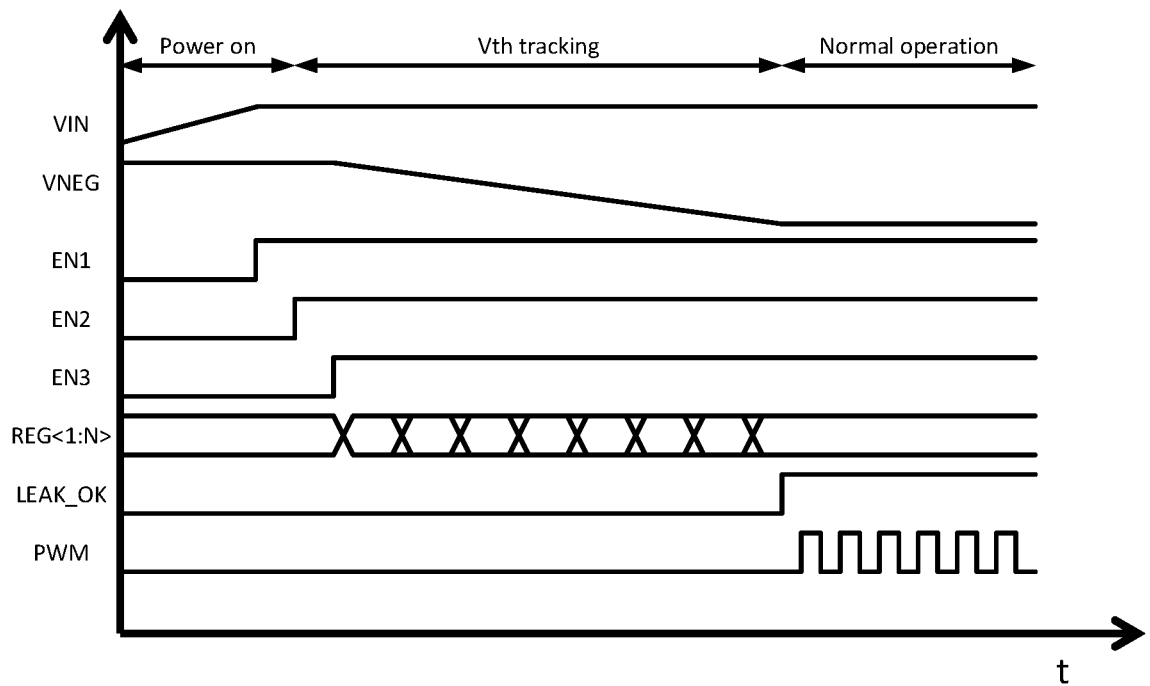

To further illustrate the operation of the proposed invention, FIG. 4A presents the circuit diagram of the situation shown in FIG. 1C, and FIG. 4B presents the timing diagram as shown in FIG. 3B to FIG. 3F correspondingly. Initially, the control circuit is power on, i.e., an operating voltage VIN is applied. Thus, in the timing diagram, the item VIN is raised from zero to operating voltage ready. Next, the controlling module sends out EN1, EN2 and EN3 in sequence to active the current detecting module, the gate voltage tracking module and the gate voltage adjusting module respectively. Thus, in the timing diagram, EN1, EN2 and EN3 are all raised from Low to High. Hence, the leakage current of the depletion mode GaN transistor can be detected firstly, the recent value of the gate voltage of the depletion mode GaN transistor can be tracked secondly, and the gate voltage of the depletion mode GaN transistor can be adjusted according to the detected leakage current and even the tracked recent value of the gate voltage lately. Thus, in the timing diagram, the values of some items are varied after EN1, EN2 and EN3 are all raised to High. After that, in situation that the leakage current is not acceptable (or viewed as being non-zero), LEAK_OK is kept low. In such situation, the voltage tracking module sends REG<1:N> to the gate voltage adjusting module, such that VNEG sent out by the gate voltage adjusting module is modified and then the operation of the gate driver is adjusted corresponding. Reasonably, the magnitude of the leakage current is varied after the gate voltage being adjusted by the gate driver. VENG gradually decreased during the period of detecting and adjusting, because the required adjustment of the gate voltage is gradually decreased while the gate voltage is approached to the threshold voltage step by step during such period. Depending on how the leakage current is varied, LEAK_OK is still Low if the varied leakage current is still not acceptable. Anyway, LEAK_OK is raised to HIGH when the leakage current is acceptable (no leakage current or the magnitude of the leakage current is almost zero). Thus, in the timing diagram, after the LEAK_OK signal being HIGH, REG<1:N> is not sent out, also VENG is decreased to a sufficiently negative voltage which modifies the gate voltage of the depletion mode GaN transistor to be almost equal to the threshold voltage of such transistor. After that, PWN is applied to control the operation of the depletion mode GaN transistor, i.e., to operate the depletion mode GaN transistor after the leakage current issue is solved and before the leakage current issue being inspected next time. Surely, to not interfere the normal operation of the depletion mode GaN transistor during its normal operation period, the controlling module generally stops the operation of the current detecting module, the gate voltage tracking module and the gate voltage adjusting module. Thus, in the timing diagram, the PWN signal is started to have varied non-zero value after the LEAK_OK signal is raised to High.

As a short conclusion, the invention may calibrate all depletion mode GaN transistors formed on same depletion mode GaN wafer with equivalent or different threshold voltages by using control circuits formed on same silicon wafer respectively so as to just eliminate (or at least minimize) leakage current for all depletion mode GaN transistors. To compare with some conventional skills adjusting all depletion mode GaN transistors formed on the same depletion mode GaN wafer to have equivalent gate voltage not larger than all threshold voltages of these depletion mode GaN transistors, the invention may balance the requirements of eliminating (at least minimizing) leakage current and enhancing (even maximizing) both reaction speed and efficiency of all depletion mode GaN transistors formed on same depletion mode GaN wafer more effectively and flexibly. Particularly, the threshold voltage and even other features of the depletion mode GaN transistor formed on GaN wafer are more sensitive to fabrication details, working environment, usage period, usage times, or even other factors but that of the control circuits formed on silicon wafer are significantly less sensitive correspondingly. Hence, the invention uses the more stable control circuit to calibrate the less stable depletion mode GaN transistor and then may obtain more objective and consistent gate voltage adjustment result.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A depletion mode GaN transistor control circuit, comprising:
   a current detecting module formed on a silicon wafer and configured to detect a leakage current of a depletion mode GaN transistor formed on a depletion mode GaN wafer; and
   a gate voltage adjusting module formed on the silicon wafer and configured to adjust the gate voltage of the depletion mode GaN transistor according to the detected leakage current;
   wherein the gate voltage adjusting module comprises both a voltage source configured to provide a fixed voltage to the gate of the depletion mode GaN transistor and a negative voltage converter configured to provide a negative voltage according to the detected current to the gate of the depletion mode GaN transistor, wherein the gate voltage of the depletion mode GaN transistor is modified by the combination of the fixed voltage and the negative voltage.

2. The control circuit according to claim 1, further comprising at least one of the following:
   the gate voltage adjusting module is configured to make the gate voltage more negative when the detected leakage current is larger than zero;
   the gate voltage adjusting module is configured to make the gate voltage more positive when the detected leakage current is zero; and
   the gate voltage adjusting module is configured to make the gate voltage to be a threshold voltage such that the transistor has just right a zero leakage current.

3. The control circuit according to claim 1, further comprising a gate voltage tracking module formed on the silicon wafer and configured to track the gate voltage of the depletion mode GaN transistor, wherein the gate voltage adjusting module is configured to adjust the gate voltage of the depletion mode GaN transistor according to both the detected leakage current and the tracked gate voltage.

4. The control circuit according to claim 1, wherein the gate voltage adjusting module comprises a negative voltage converter configured to provide a negative voltage less than the tracked gate voltage to the gate of the depletion mode GaN transistor so as to update the gate voltage of the depletion mode GaN transistor.

5. The control circuit according to claim 1, wherein the leakage current detecting module comprises an adjustable current mirror for duplicating and enlarging the leakage current such that the gate voltage adjusting module is configured to adjust the gate voltage of the depletion mode GaN transistor according to directly an enlarged detected leakage current.

6. The control circuit according to claim 1, further comprising a controlling module formed on the silicon wafer and configured to operate both the current detecting module and the gate voltage adjusting module in one or more of the following situations: the depletion mode GaN transistor is operated first time, the depletion mode GaN transistor has been operated a certain number of times, the depletion mode GaN transistor has been operated for a certain period of time, the depletion mode GaN transistor has been operated under an extreme working condition, and an external Vth calibration command is received.

7. A depletion mode GaN product, comprising:
   one or more depletion mode GaN transistors formed on a depletion mode GaN wafer; and
   one or more control circuits formed on a silicon wafer;
   wherein the control circuits and the depletion mode GaN transistors are paired one-to-one with each other;
   wherein each control circuit detects leakage current of a paired depletion mode GaN transistor and then adjusts gate voltage of the paired depletion mode GaN transistor accordingly;
   wherein each control circuit comprises a current detecting module configured to detect the leakage current of a paired depletion mode GaN transistor and a gate voltage adjusting module configured to adjust the gate voltage of the paired depletion mode GaN transistor according to the detected leakage current;
   wherein the gate voltage adjusting module comprises both a voltage source configured to provide a fixed voltage to the gate of the paired depletion mode GaN transistor and a negative voltage converter configured to provide a negative voltage according to the detected current to the gate of the paired depletion mode GaN transistor, wherein the gate voltage of the paired depletion mode GaN transistor is modified by the combination of the fixed voltage of the negative voltage.

8. The GaN product according to claim 7, wherein each control circuit comprises a controlling module configured to operate both the current detecting module and the gate voltage adjusting module in one or more of the following situations: the paired GaN transistors are operated first time, the paired depletion mode GaN transistors have been operated a certain number of times, the paired depletion mode GaN transistors have been operated for a certain period of time, the paired depletion mode GaN transistors have been operated under an extreme working condition, and an external Vth calibration command is received.

9. The GaN product according to claim 7, each control circuit further comprising at least one of the following:
   the gate voltage adjusting module is configured to make the gate voltage more negative when the detected leakage current is larger than zero;
   the gate voltage adjusting module is configured to make the gate voltage more positive when the detected leakage current is zero; and
   the gate voltage adjusting module is configured to make the gate voltage to be a threshold voltage such that the paired depletion mode GaN transistor has right a zero leakage current.

10. The GaN product according to claim 7, wherein each control circuit comprises a gate voltage tracking module and configured to track the gate voltage of the paired depletion mode GaN transistor, wherein the gate voltage adjusting module is configured to adjust the gate voltage of the paired depletion mode GaN transistor according to both the detected leakage current and the tracked gate voltage.

11. The GaN product according to claim 7, wherein the gate voltage adjusting module comprises a negative voltage converter configured to provide a negative voltage less than the tracked gate voltage to the gate of the paired depletion mode GaN transistor so as to update the gate voltage of the depletion mode GaN transistor.

12. The GaN product according to claim 7, wherein the leakage current detecting module comprises an adjustable current mirror for duplicating and enlarging the leakage current such that the gate voltage adjusting module is configured to adjust the gate voltage of the paired depletion mode GaN transistor according to directly an enlarged detected leakage current.

* * * * *